(12) United States Patent
Ukawa et al.

(10) Patent No.: US 11,322,658 B2
(45) Date of Patent: May 3, 2022

(54) LIGHT-EMITTING DEVICE AND METHOD OF MANUFACTURING THE SAME

(71) Applicant: NICHIA CORPORATION, Anan (JP)

(72) Inventors: Hiroaki Ukawa, Itano-gun (JP); Ryuichi Nakagami, Anan (JP); Ryuji Muranaka, Anan (JP)

(73) Assignee: NICHIA CORPORATION, Anan (JP)

( * ) Notice: Subject to any disclaimer, the term of this patent is extended or adjusted under 35 U.S.C. 154(b) by 309 days.

(21) Appl. No.: 16/775,471

(22) Filed: Jan. 29, 2020

(65) Prior Publication Data

US 2020/0251617 A1    Aug. 6, 2020

(30) Foreign Application Priority Data

Jan. 31, 2019  (JP) .............................. JP2019-016498

(51) Int. Cl.
| | |
|---|---|
| *H01L 33/48* | (2010.01) |
| *H01L 33/50* | (2010.01) |
| *H01L 33/58* | (2010.01) |
| *H01L 33/60* | (2010.01) |
| *H01L 33/62* | (2010.01) |
| *H01L 33/54* | (2010.01) |
| *H01L 25/075* | (2006.01) |

(52) U.S. Cl.
CPC .......... *H01L 33/486* (2013.01); *H01L 33/502* (2013.01); *H01L 33/58* (2013.01); *H01L 33/60* (2013.01); *H01L 33/62* (2013.01); *H01L 2933/0041* (2013.01); *H01L 2933/0058* (2013.01); *H01L 2933/0066* (2013.01)

(58) Field of Classification Search
CPC ......... H01L 33/58; H01L 33/54; H01L 33/60; H01L 33/62; H01L 33/486; H01L 2933/0058

See application file for complete search history.

(56) References Cited

U.S. PATENT DOCUMENTS

2013/0070441 A1   3/2013  Moon et al.
2013/0121000 A1   5/2013  Lee et al.
(Continued)

FOREIGN PATENT DOCUMENTS

EP   2784833 A1 * 10/2014 ........... H01L 33/486
JP   2013-106047 A   5/2013
(Continued)

*Primary Examiner* — Marcos D. Pizarro
*Assistant Examiner* — Antonio B Crite
(74) *Attorney, Agent, or Firm* — Foley & Lardner LLP

(57) ABSTRACT

A light-emitting device includes a base member including a first lead, a second lead, and a securing member securing the first lead and the second lead, a light-emitting element mounted on an upper surface of the base member, a frame disposed on the upper surface of the base member to surround the light-emitting element, a first member covering at least a portion of an upper surface of the securing member exposed at an outer peripheral side of the frame in a top view, the first member being in contact with an outer lateral surface of the frame and containing a reflective material, and a second member covering the light-emitting element, the frame, and the first member. The first member has an inclined region in a cross-sectional view. A maximum height of the inclined region is less than a height of an upper end of the frame.

19 Claims, 14 Drawing Sheets

(56) References Cited

U.S. PATENT DOCUMENTS

| | | |
|---|---|---|
| 2014/0291716 A1 | 10/2014 | Ukawa |
| 2016/0005942 A1 | 1/2016 | Ukawa |
| 2016/0079507 A1 | 3/2016 | Lee et al. |
| 2017/0194542 A1 | 7/2017 | Ukawa |
| 2018/0315908 A1 | 11/2018 | Lee et al. |
| 2019/0140144 A1 | 5/2019 | Omori et al. |
| 2020/0357775 A1 | 11/2020 | Hirasawa et al. |

FOREIGN PATENT DOCUMENTS

| | | |
|---|---|---|
| JP | 2013-131519 A | 7/2013 |
| JP | 2014-209602 A | 11/2014 |
| WO | WO-2017/188278 A1 | 11/2017 |
| WO | WO-2017/209143 A1 | 12/2017 |

\* cited by examiner

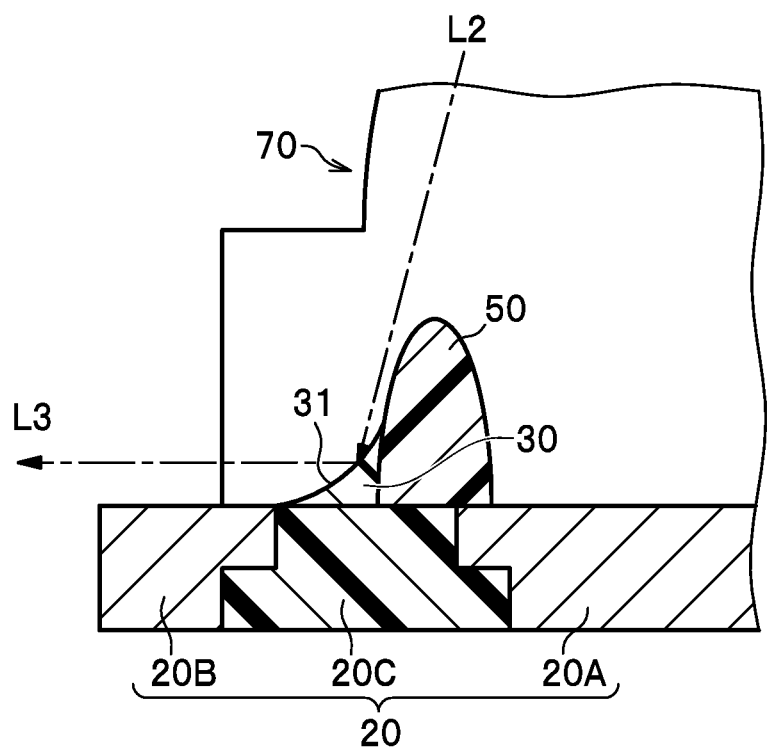

LIGHT-EMITTING DEVICE AND METHOD OF MANUFACTURING THE SAME

CROSS-REFERENCE TO RELATED APPLICATION

This application claims priority to Japanese Patent Application No. 2019-016498, filed on Jan. 31, 2019, the contents of which are hereby incorporated by reference in their entirety.

BACKGROUND

The present disclosure relates to a light-emitting device and a method of manufacturing the same.

Light-emitting devices employing light-emitting elements, such as light-emitting diodes or laser diodes, are used in various fields including general lighting such as interior lighting, light sources for vehicles, and backlight devices for liquid-crystal display devices. The required performance for these light-emitting devices is becoming increasingly high, and further improvement in reliability is required.

A light-emitting device is known in which a light-emitting element is mounted on an upper surface of a lead, a resin frame surrounds the light-emitting element, a first sealing resin is filled inside the resin frame to seal the light-emitting element, and a second sealing resin covers the resin frame and the first sealing resin (for example, see Japanese Patent Publication No. 2014-209602).

SUMMARY

According to increase in variety of use of such light-emitting devices, further improvement in the light extraction and light distribution of the light-emitting device is required.

Accordingly, one object of certain embodiments according to the present disclosure is to provide a light-emitting device with good light-extraction and light-distribution, and a method of manufacturing the same.

A light-emitting device according to one embodiment of the present disclosure includes a base member including a first lead, a second lead, and a securing member securing the first lead and the second lead, a light-emitting element mounted on an upper surface of the base member, a frame disposed on the upper surface of the base member to surround the light-emitting element, a first member covering at least a portion of an upper surface of the securing member exposed at an outer peripheral side of the frame in a top view, the first member being in contact with an outer lateral surface of the frame and containing a reflective material, and a second member covering the light-emitting element, the frame, and the first member. The first member has an inclined region in a cross-sectional view. A height of the inclined region is less than a height of an upper end of the frame.

A method of manufacturing a light-emitting device according to one embodiment of the present disclosure includes mounting a light-emitting element on an upper surface of a base member including a first lead, a second lead, and a securing member securing the first lead and the second lead; disposing a first member comprising a reflective material on the upper surface of the base member to surround the light-emitting element and to cover at least a portion of an upper surface of the securing member; disposing a frame on the upper surface of the base member such that the frame is in contact with an inner lateral surface of the first member and the upper surface of the base member, has a height from the base member greater than a height of the first member in a cross-sectional view, and surrounds the light-emitting element; and disposing a second member to cover the light-emitting element, the frame, and the first member.

A method of manufacturing a light-emitting device according to another embodiment of the present disclosure includes mounting a light-emitting element on an upper surface of a base member including a first lead, a second lead, and a securing member securing the first lead and the second lead; disposing a frame on the upper surface of the base member to surround the light-emitting element; disposing a first member comprising a reflective material such that the first member is in contact with an outer lateral surface of the frame and the upper surface of the base member, covers at least a portion of an upper surface of the securing member exposed at an outer peripheral side of the frame, and has a height from the base member less than a height of the frame in a cross-sectional view; and disposing a second member to cover the light-emitting element, the frame, and the first member.

A light-emitting device according to certain embodiments of the present disclosure and a method of manufacturing the same allows the light emitting device with good light-extraction and light-distribution.

BRIEF DESCRIPTION OF THE DRAWINGS

FIG. 1G is a schematic cross-sectional view of yet another example of the first member in FIG. 1C.

DETAILED DESCRIPTION

Figure 1A:
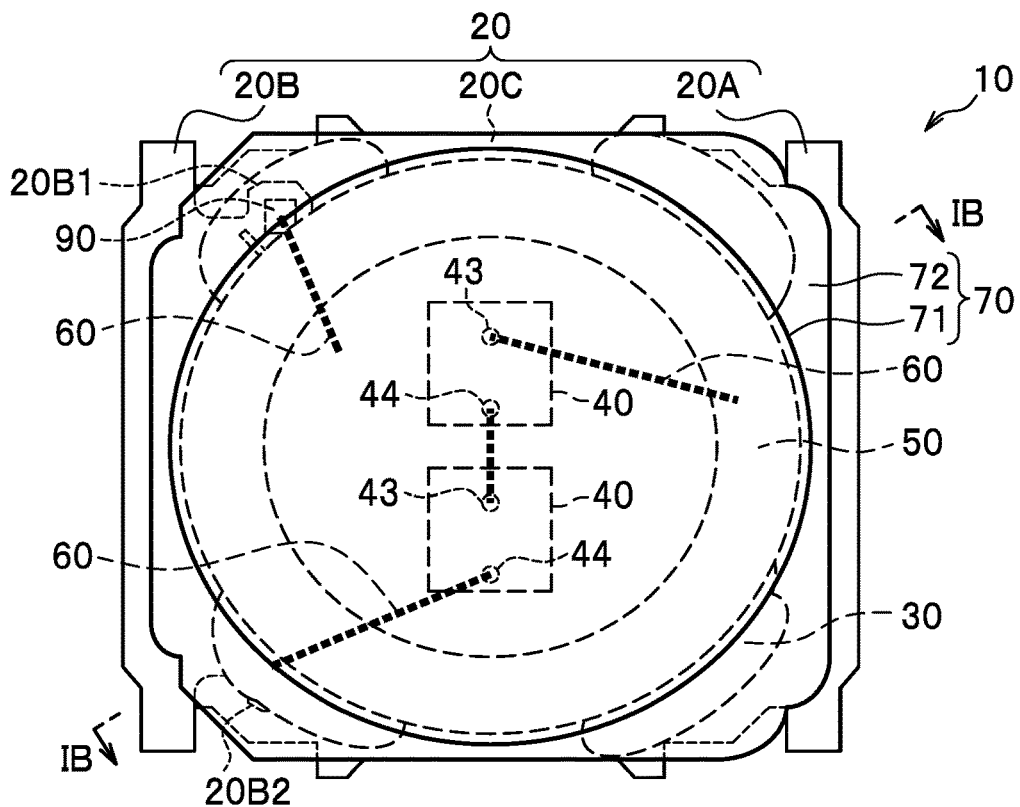
FIG. 1A is a schematic plan view of the structure of a light-emitting device according to a first embodiment.

Certain embodiments of the present invention will be described with reference to the drawings. In the description below, examples of light-emitting devices are described to give a concrete form to the technical ideas of the present invention. However, the present invention is not limited to the examples described below. Unless specifically stated otherwise, the sizes, materials, shapes, and relative positions of components described in the embodiments are not intended to limit the scope of the present invention, but are described as examples. Sizes or positional relations of members illustrated in the drawings may be exaggerated in order to clarify the descriptions. In the descriptions below, the same term or reference numeral represents the same member or a member made of the same material, and its detailed description will be omitted as appropriate.

First Embodiment

Light-Emitting Device

A light-emitting device according to a first embodiment will be described.

Figure 1B:
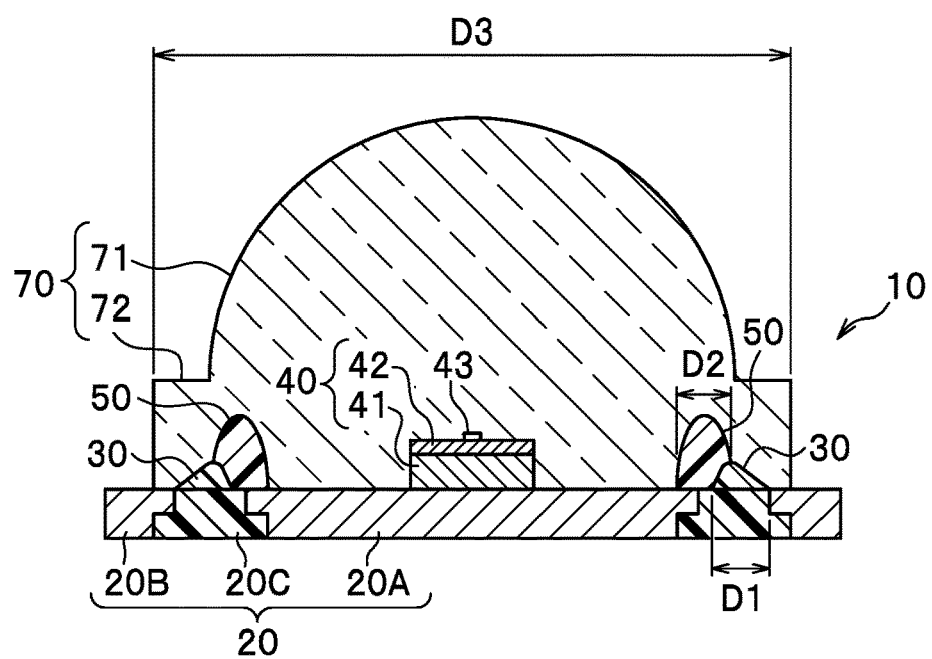
FIG. 1B is a schematic cross-sectional view taken along the line IB-IB of FIG. 1A.
Figure 1C:
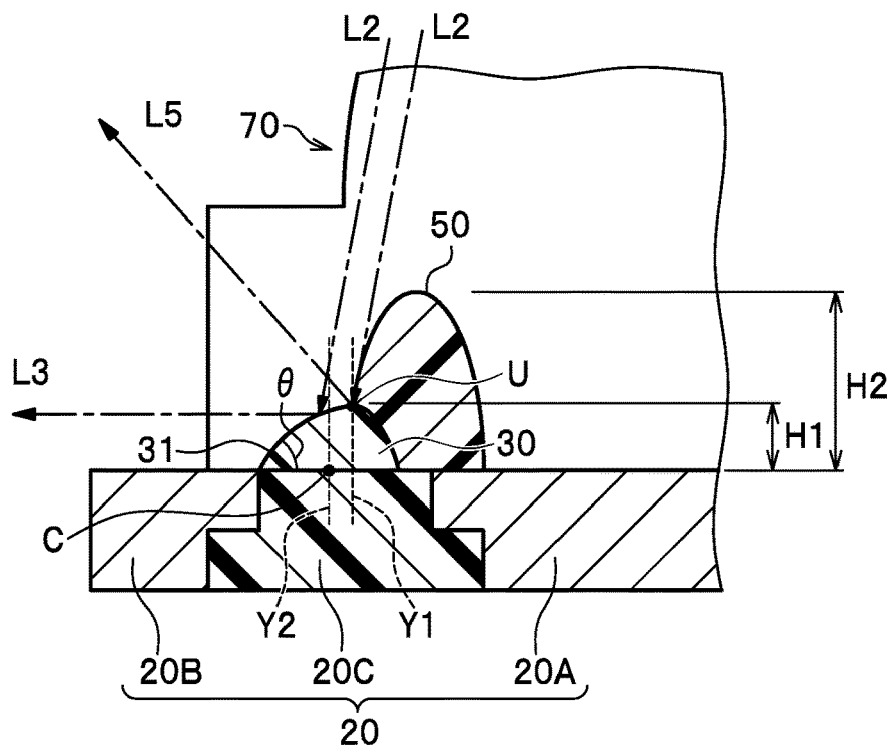
FIG. 1C is a schematic partially-enlarged cross-sectional view of FIG. 1B.
Figure 1D:
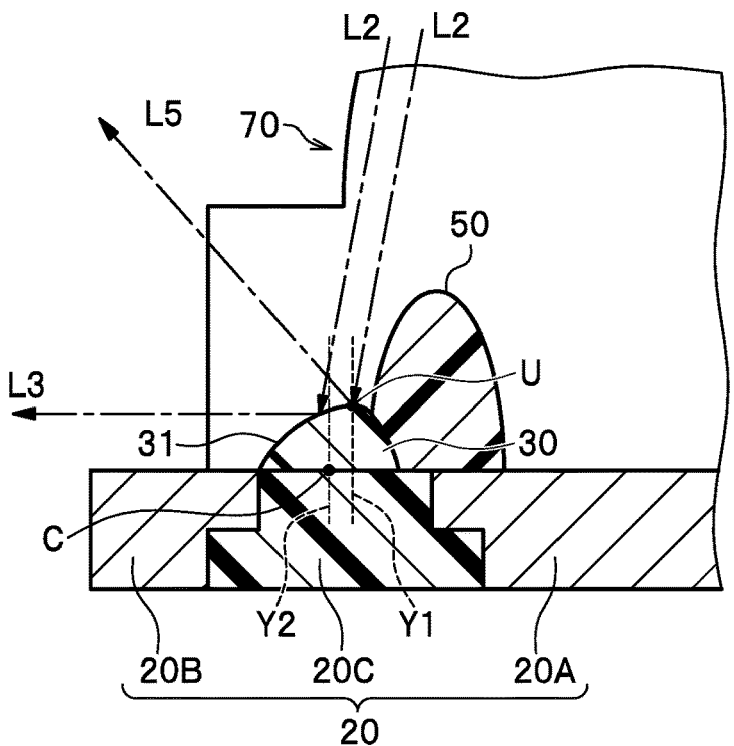
FIG. 1D is a schematic cross-sectional view of another example of a first member in FIG. 1C.
Figure 1E:
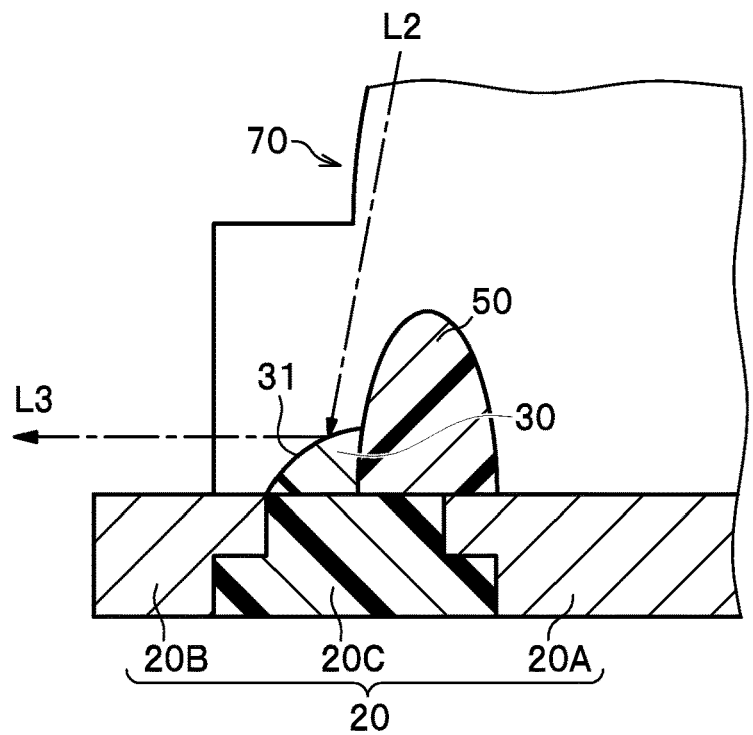
FIG. 1E is a schematic cross-sectional view of even another example of the first member in FIG. 1C.
Figure 1F:
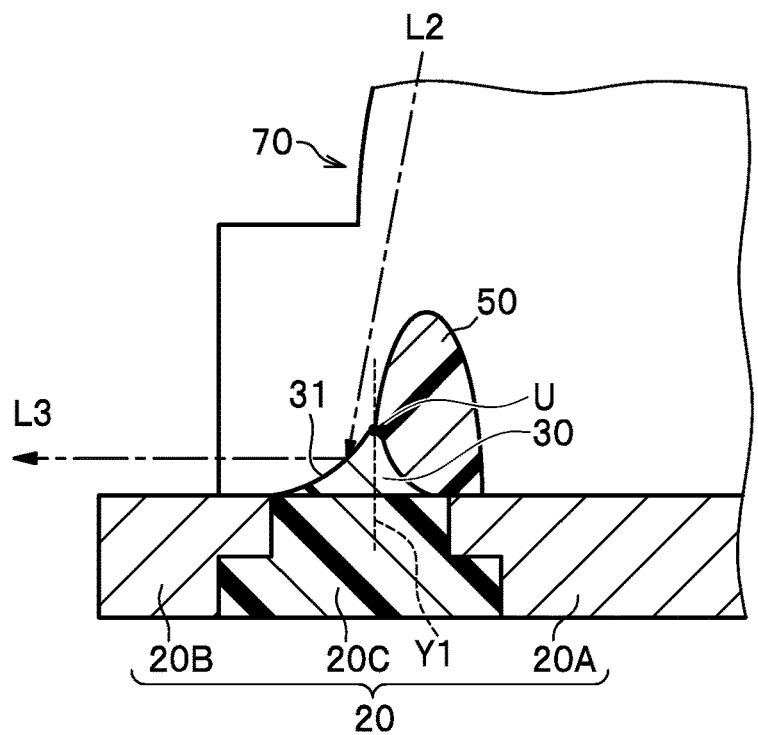
FIG. 1F is a schematic cross-sectional view of still another example of the first member in FIG. 1C.
Figure 2:
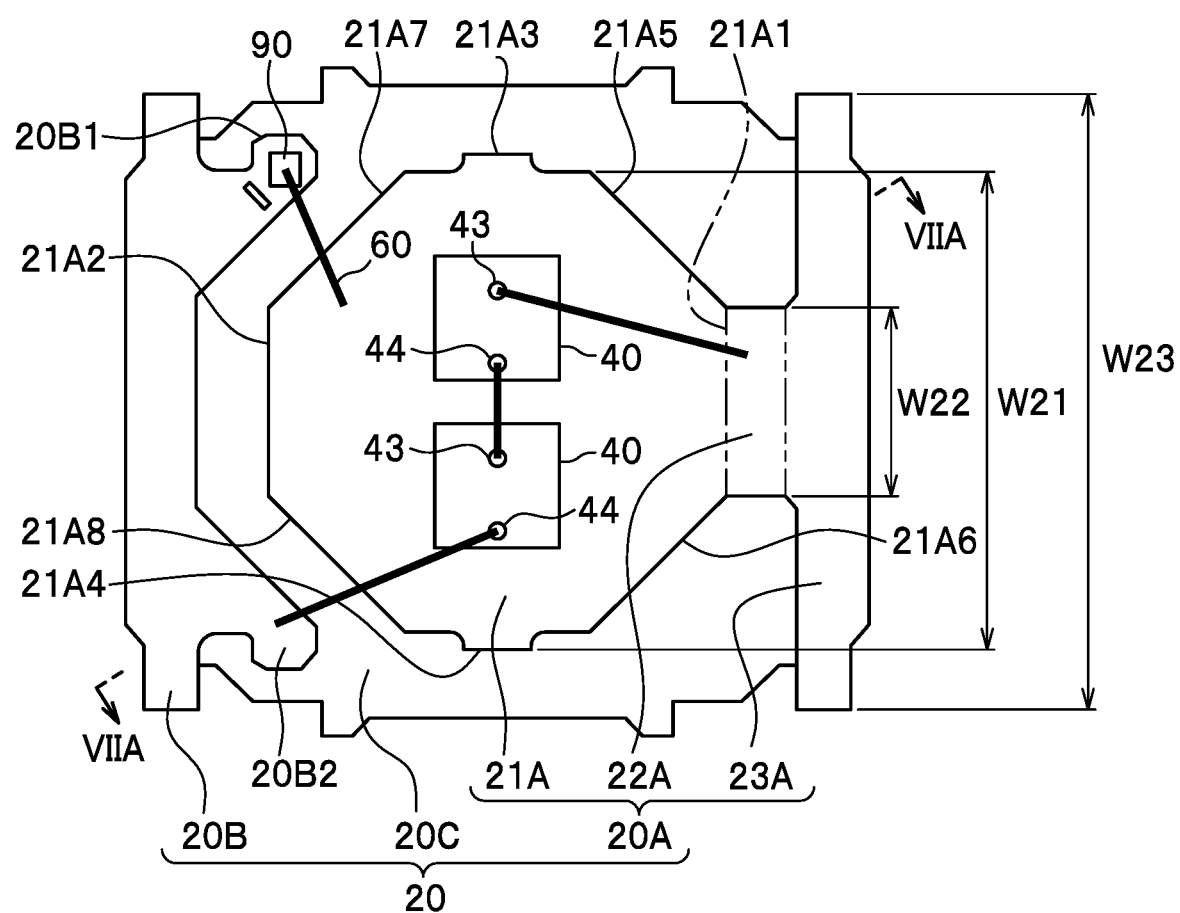
FIG. 2 is a schematic plan view of the light-emitting device according to the first embodiment, in which a frame, first members, and a second member are not shown.
Figure 3:
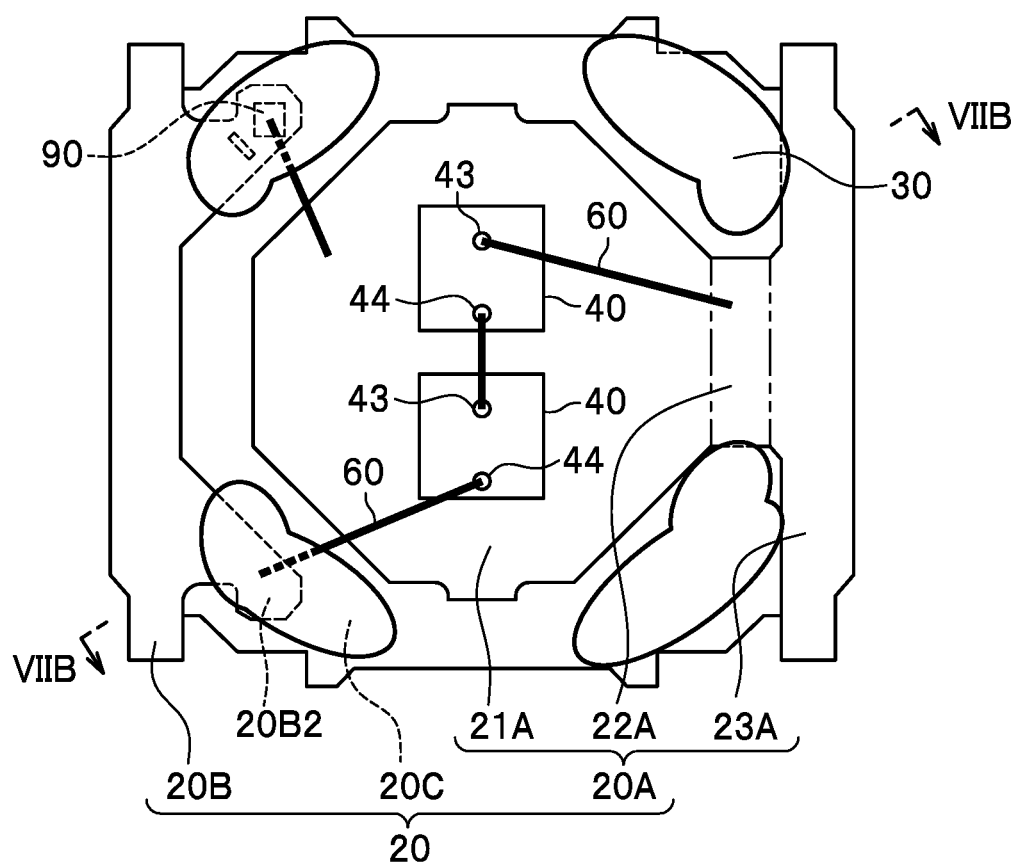
FIG. 3 is a schematic plan view of the light-emitting device according to the first embodiment, in which the frame and the second member are not shown.
Figure 4:
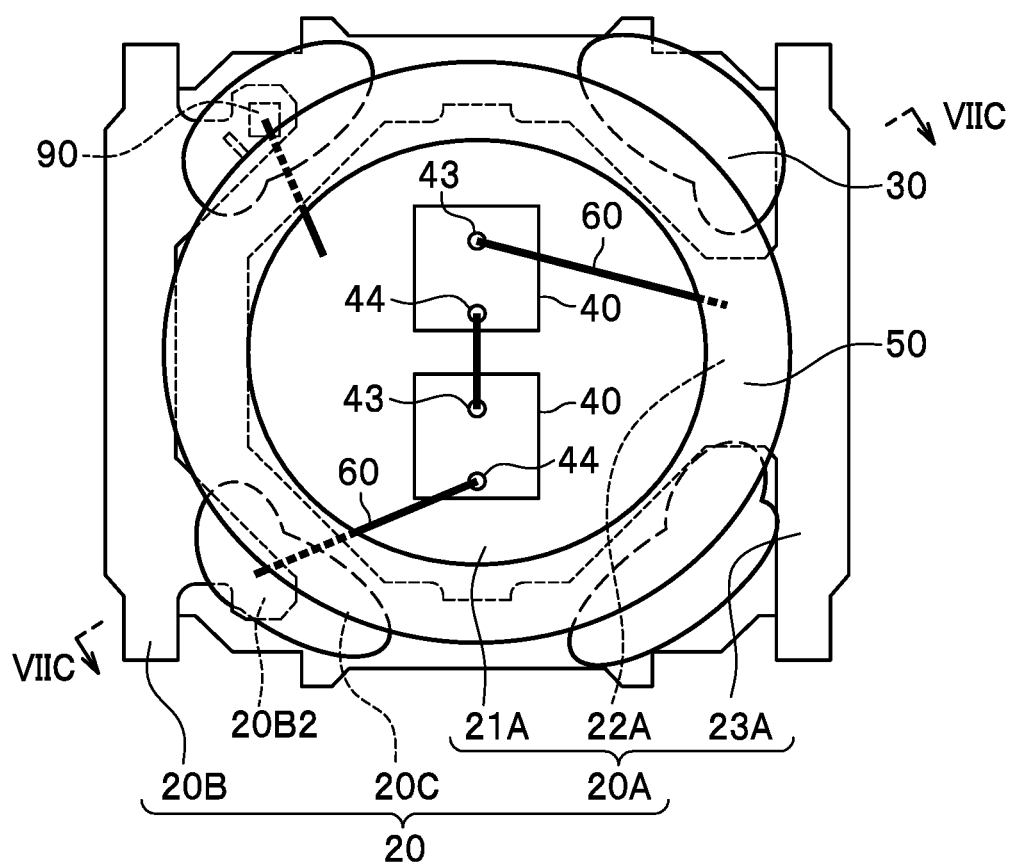
FIG. 4 is a schematic plan view of the light-emitting device according to the first embodiment, in which the second member is not shown.
Figure 5A:
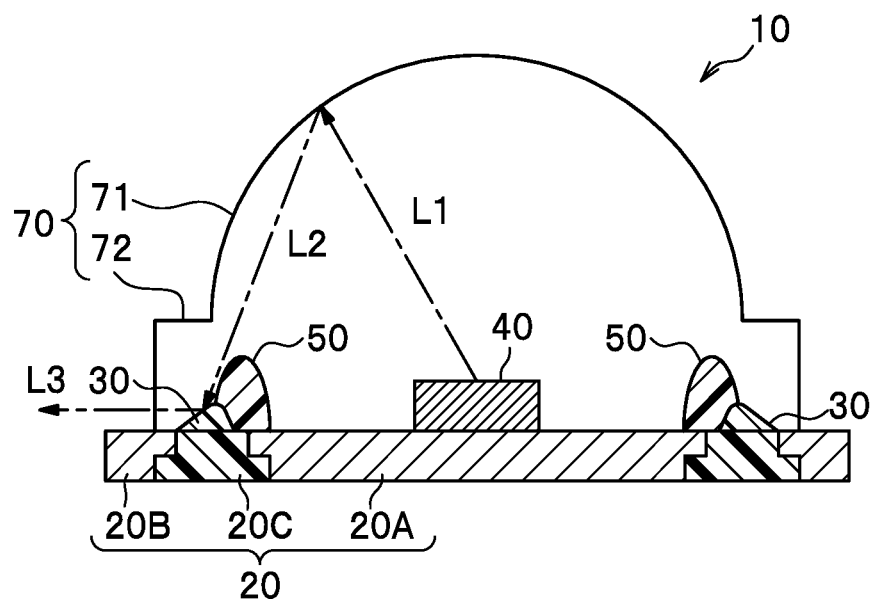
FIG. 5A is a schematic cross-sectional view for illustrating the operations and effects of the first members.
Figure 5B:
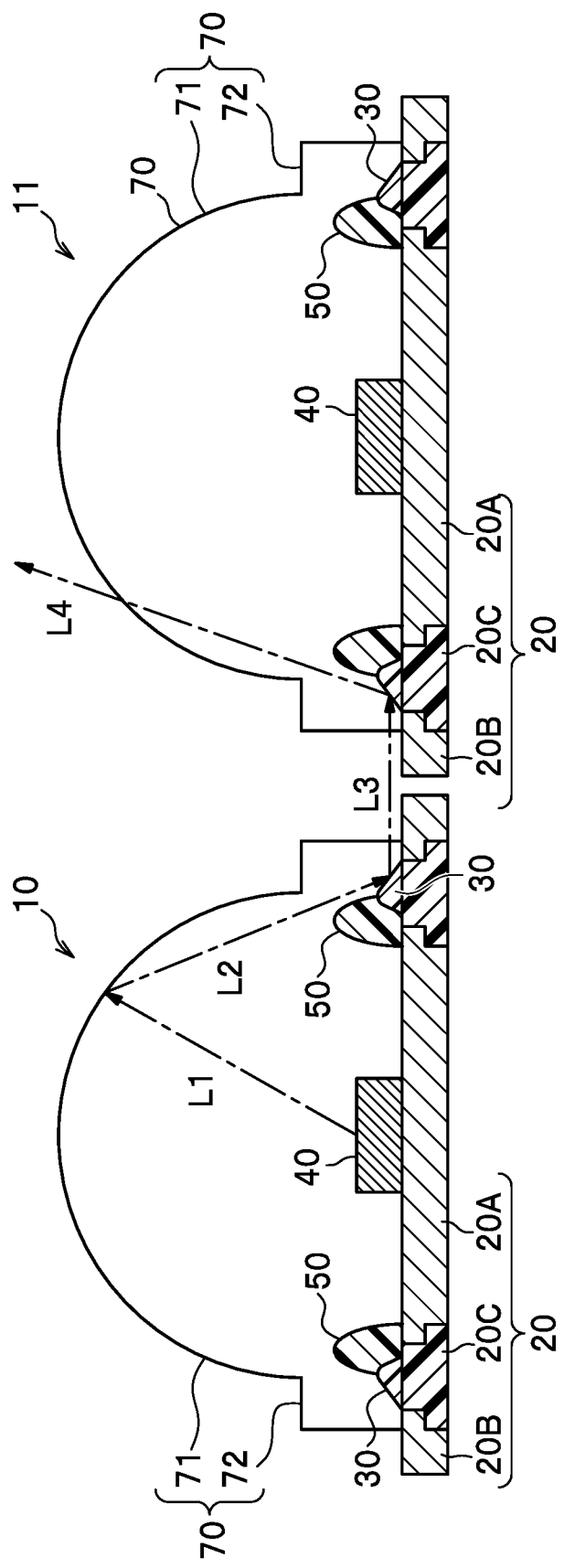
FIG. 5B is a schematic cross-sectional view for illustrating the operations and effects of the first members.

FIG. 1A is a schematic plan view of the structure of the light-emitting device according to the first embodiment. FIG. 1B is a schematic cross-sectional view taken along the line IB-IB of FIG. 1A. FIG. 1C is a schematic partially-enlarged cross-sectional view of FIG. 1B. FIG. 1D is a schematic cross-sectional view of another example of a first member in FIG. 1C. FIG. 1E is a schematic cross-sectional view of even another example of the first member in FIG. 1C. FIG. 1F is a schematic cross-sectional view of still another example of the first member in FIG. 1C. FIG. 1G is a schematic cross-sectional view of yet another example of the first member in FIG. 1C. FIG. 2 is a schematic plan view of the light-emitting device according to the first embodiment, in which a frame, first members, and a second member are not shown. FIG. 3 is a schematic plan view of the light-emitting device according to the first embodiment, in which the frame and the second member are not shown. FIG. 4 is a schematic plan view of the light-emitting device according to the first embodiment, in which the second member is not shown. FIG. 5A is a schematic cross-sectional view for illustrating the operations and effects of the first members. FIG. 5B is a schematic cross-sectional view for illustrating the operations and effects of the first members.

As shown in FIG. 1A to FIG. 4, a light-emitting device 10 includes a base member 20 that includes a first lead 20A, a second lead 20B, and a securing member 20C securing the first lead 20A and the second lead 20B; light-emitting elements 40 mounted on an upper surface of the base member 20; a frame 50 disposed on the upper surface of the base member 20 to surround the light-emitting elements 40; first members 30 covering at least a portion of the upper surface of the securing member 20C exposed at an outer peripheral side of the frame 50 in a top view, being in contact with the outer lateral surface of the frame 50, and containing a reflective material; and a second member 70 covering the light-emitting elements 40, the frame 50, and the first members 30. Each of the first members 30 includes an inclined region 31 in a cross-sectional view, and a height H1 of the inclined region 31 is less than a height H2 of the upper end of the frame 50. Components of the light-emitting device will be described below.

Base Member

As shown in FIG. 2, the base member 20 includes the first lead 20A, the second lead 20B, and the securing member 20C that secures the first lead 20A and the second lead 20B such that the leads are separated from each other. The upper surface of the first lead 20A, the upper surface of the second lead 20B, and the upper surface of the securing member 20C can be in the same plane. The lower surface of the first lead 20A, the lower surface of the second lead 20B, and the lower surface of the securing member 20C can also be in the same plane.

For example, the first lead 20A includes a mounting portion 21A on which the light-emitting elements 40 are disposed, the mounting portion 21A having a substantially polygonal shape and located at the center of the base member 20, a terminal portion 23A located at an end side of the base member 20, and a connecting portion 22A connecting the mounting portion 21A to the terminal portion 23A. A width W22 of the connecting portion 22A is less than a width W21 of the mounting portion 21A and less than a width W23 of the terminal portion 23A. The width W23 of the terminal portion 23A is greater than the width W21 of the mounting portion 21A and is approximately equal to the width of the base member 20. The connecting portion 22A includes a region connected to a wire 60 of a light-emitting element 40. A "width" of each of the first lead 20A and the second lead 20B refers to the maximum length of each of the first lead 20A and the second lead 20B in the direction perpendicular to the direction of extension of the connecting portion 22A from the mounting portion 21A.

The mounting portion 21A has a substantially octagonal shape. The mounting portion 21A has a first side 21A1 having a length equal to the width W22 of the connecting portion 22A, a second side 21A2 parallel to and opposite to the first side 21A1, a third side 21A3 perpendicular to the first side 21A1 and the second side 21A2, a fourth side 21A4 perpendicular to the first side 21A1 and the second side 21A2 and opposite to the third side 21A3, an inclined fifth side 21A5 connecting the first side 21A1 and the third side 21A3, an inclined sixth side 21A6 connecting the first side 21A1 and the fourth side 21A4, an inclined seventh side 21A7 connecting the second side 21A2 and the third side 21A3, and an inclined eighth side 21A8 connecting the second side 21A2 and the fourth side 21A4. In addition, the mounting portion 21A has projections each projected from a respective one of the third side 21A3 and the fourth side 21A4.

The second lead 20B is disposed such that the intervals between the second lead 20B and the second side 21A2, the inclined seventh side 21A7, and the inclined eighth side 21A8 of the mounting portion 21A are substantially uniform. The second lead 20B has a width substantially equal to the width W23 of the terminal portion 23A. Further, the second lead 20B is bent at two opposite end portions of the second lead 20B in the longer axis direction toward the mounting portion 21A to have first and second connecting end portions 20B1 and 20B2, so as to increase the area of the second lead 20B. The first connecting end portion 20B1 has a region on which a protective element 90 is mounted. The second connecting end portion 20B2 has a region connected to a wire 60 of a light-emitting element 40.

The area of the first lead 20A is preferably greater than the area of the second lead 20B in a plan view. The light-emitting elements 40 are mounted on the upper surface of the mounting portion 21A of the first lead 20A. Accordingly, increase of the area of the mounting portion 21A of the first lead 20A allows for facilitating heat generated in the light-emitting elements 40 to be transmitted to the first lead 20A. This allows for reducing increase in the temperature of the light-emitting elements 40, so that reliability of the light-emitting device 10 can be improved.

End surfaces of the first lead 20A and/or the second lead 20B preferably have recesses or projections. With recesses or projections located at which the first lead 20A and/or the second lead 20B are in contact with the securing member 20C, contact area between the securing member 20C and the first lead 20A and/or the second lead 20B can be increased. Accordingly, adhesion between the securing member 20C and the first lead 20A and/or the second lead 20B can be enhanced.

The first lead 20A and the second lead 20B are used to apply a voltage from an external power supply to electronic components such as the light-emitting elements 40. The first lead 20A and the second lead 20B are preferably made of materials with relatively large thermal conductivities. For example, using a material with a thermal conductivity of about 200 W/(m·K) or more allows for facilitating transmission of heat generated in the light-emitting elements 40 to the first lead 20A.

The first lead 20A and the second lead 20B are preferably made of materials with high strength that are easy to process by punching or cutting. For example, a single layer or a layered body of a metal such as copper, aluminum, gold, silver, tungsten, iron, nickel, an alloy of two or more of these metals, phosphor bronze, or a copper-iron alloy can be used for a base member of the first lead 20A and the second lead 20B. A metal layer may be entirely or partially disposed on surfaces of the first lead 20A and the second lead 20B. The metal layer may be disposed on only one of the first and second leads 20A and 20B.

A reflective film may be disposed on each of the first lead 20A and the second lead 20B. One or two or more metals such as aluminum, copper, or gold can be used for the reflective film. Silver is preferably used for the reflective film. This structure allows for increasing the light extraction efficiency of the light-emitting device 10.

Examples of a method for forming the reflective film on the first lead 20A and the second lead 20B include plating, vapor deposition, sputtering, and ion beam assisted deposition. The reflective film has such a thickness that allows the film to effectively reflect light emitted from the light-emitting elements 40. For example, the thickness of the reflective film is approximately in a range of 20 nm to 10 μm, preferably approximately in a range of 50 nm to 5 μm, more preferably approximately in a range of 100 nm to 3 μm. The thicknesses and the shapes of the first lead 20A and the second lead 20B can be appropriately selected in the ranges known in the art.

The securing member 20C is disposed surrounding the first lead 20A, between the second lead 20B and the first lead 20A, and around the one end and the other end of the second lead 20B to secure the first lead 20A and the second lead 20B. The fixing member 20C is disposed by, for example, injecting a molding resin into regions (resin injecting portions) that are surrounded by the terminal portion 23A, the connecting portion 22A, and the two inclined sides (the fifth side 21A5 and the sixth side 21A6) of the mounting portion 21A and broaden as the distances from the connecting portion 22A increase, to fill the molding resin into the regions around the first lead 20A, between the second lead 20B and the first lead 20A, and around two opposite end portions of the second lead 20B. By injecting the molding resin from the resin injecting portions as described above, the molding resin can be easily filled into the regions apart from the resin injecting portions, such as the region between the second lead 20B and the first lead 20A. The mounting portion 21A of the first lead 20A has a substantially polygonal shape, and the inclined fifth side 21A5, inclined sixth side 21A6, inclined seventh side 21A7, and inclined eighth side 21A8 are located at the corners, so that the molding resin is easily guided to the region around the first lead 20A, the region between the second lead 20B and the first lead 20A, and the regions around two opposite end portions of the second lead 20B.

Examples of the material of the securing member 20C include resins such as epoxy resins, silicone resins, BT resins, polyamide resins, polyimide resins, nylon resins, and unsaturated polyesters and ceramics. A colorant, filling material, or reinforcing fiber known in the art may be mixed with these materials. Using a white filler such as titanium oxide or zinc oxide for the colorant allows for increasing the light extraction efficiency of the light-emitting device. With a black filler, such as carbon black, having a large heat emission coefficient contained in the securing member 20C, efficient dissipation of heat from the light-emitting elements 40 can be facilitated, and strength of the resin can be increased. Examples of the filling material include silicon oxide and aluminum oxide. Examples of the reinforcing fiber include glass, calcium silicate, and potassium titanate.

While the first lead 20A includes the mounting portion 21A on which the light-emitting elements 40 are mounted in the above description, the second lead 20B may include a mounting portion. An example of a case in which the first lead 20A includes the mounting portion 21A will be described below.

Light-Emitting Elements 40

The light-emitting elements 40 are mounted on the upper surface of the mounting portion 21A of the first lead 20A. The light-emitting elements 40 are semiconductor elements that emit light when voltage is applied, and an upper surface of each of the light-emitting elements 40 is a light-emitting surface. Any appropriate number of the light-emitting elements 40 may be mounted on the upper surface of the mounting portion 21A. While two light-emitting elements 40 are mounted on the upper surface of the mounting portion 21A in the drawings, one or three or more light-emitting elements 40 may be mounted on the upper surface of the mounting portion 21A.

Each of the light-emitting elements 40 preferably includes an element substrate 41 located at the base member 20 side and made of sapphire or the like, and a semiconductor layer 42 disposed on the element substrate 41 and made of a nitride semiconductor or the like. The emission wavelength of the light-emitting element 40 is selected in the range of the ultraviolet to infrared range including the visible light range (380 nm to 780 nm). For example, $In_XAl_YGa_{1-X-Y}N$ (where 0≤X, 0≤Y, and X+Y≤1) can be used for the nitride semiconductor for the light-emitting element 40 with a peak wavelength in a range of 430 nm to 490 nm. The light-emitting element 40 may be disposed on the upper surface of the first lead 20A via a submount.

The light-emitting element 40 may have any appropriate shape such as polygonal shapes including triangles, quadrangles, and hexagons and other shapes close to these shapes in a top view. The light-emitting element 40 may have a structure in which an n-electrode 43 and a p-electrode 44 are disposed on a single surface side, or may have a structure in which each of the n-electrode 43 and the p-electrode 44 is disposed on a respective one of two different surfaces (such as the upper surface and the lower surface). The n-electrode 43 and the p-electrode 44 of the light-emitting element 40 are connected to the first lead 20A and the second lead 20B by wires 60, respectively. The n-electrode 43 and the p-electrode 44 of the light-emitting element 40 may be connected directly to the second lead 20B and the first lead 20A, respectively. A metal material with a good electrical conductivity, such as gold, aluminum, copper, or silver, may be used for the wires 60.

When the light-emitting element 40 is provided with electrodes on a single surface side of the light-emitting element 40, the light-emitting element 40 is face-up mounted on the upper surface of the first lead 20A. The expression "face-up mounted" as used herein indicates that the light-emitting element 40 is mounted such that a surface of the light-emitting element 40 opposite to a surface of the light-emitting element 40 provided with the electrodes faces the base member 20. For a bonding member that connects the light-emitting element 40 and the first lead 20A, an insulating bonding member or an electrically-conductive bonding member may be used, and a known bonding member can be used. Examples of the insulating bonding member include epoxy resins, silicone resins, and modified resins of these resins. Examples of the electrically-conductive bonding member include pastes of electrically-conductive materials such as silver, gold, or palladium, solders such as Au—Sn eutectic solders, and brazing materials such as low-melting-point metals.

When the light-emitting element 40 includes electrodes on different surfaces of the light-emitting element 40, a bonding member that connects the light-emitting element 40 and an electrically-conductive bonding member is used for the first lead 20A, and a known bonding member may be used for the first lead 20A. Examples of the electrically-conductive bonding member include pastes of electrically-conductive materials such as silver, gold, or palladium, solders such as Au—Sn eutectic solders, and brazing materials such as low-melting-point metals.

Frame

As shown in FIG. 4, the frame 50 is a frame with a loop shape disposed on the upper surface of the base member 20 to surround the light-emitting elements 40. The inner periphery and the outer periphery of the frame 50 may have various shapes including circles, ellipses, polygons such as squares, hexagons, or octagons, and polygons with rounded corners in a top view. The frame 50 can be formed by disposing an unhardened material for the frame 50 in a region in which the frame 50 is to be formed, and then hardening the material for the frame 50.

The frame 50 is located on the boundary between the first lead 20A and the securing member 20C to cover the connecting portion between the first lead 20A and the securing member 20C. That is, the frame 50 is preferably disposed such that only the mounting portion 21A of the first lead 20A is exposed inside the frame 50 and such that the securing member 20C is not exposed inside the frame 50. With the securing member 20C not exposed inside the frame 50, a black filler or the like contained in the securing member 20C does not absorb light emitted from the light-emitting elements. Accordingly, the upper surface of the mounting portion 21A reflects light emitted from the light-emitting elements to improve the light extraction of the light-emitting device 10.

The size of a cross-sectional diameter D2 (see FIG. 1B) of the frame 50 is appropriately selected such that the mounting portion 21A of the first lead 20A is exposed inside the frame 50 and such that the first lead 20A (the terminal portion 23A), a portion of the second lead 20B, and a portion of the securing member 20C are exposed outside the frame 50.

The frame 50 (see FIGS. 1B and 1C) may have any appropriate cross-sectional shape. Various shapes such as circular shapes including partial-circular shapes, elliptic shapes including partial-elliptic shapes, and rectangular shapes, preferably semi-elliptic shapes may be employed for the cross-sectional shape of the frame 50. In the cross-sectional shape of the frame 50, the outer lateral surface is symmetrical or asymmetrical to the inner lateral surface. When the cross-sectional shape of the frame 50 is asymmetrical, the inclination of the outer lateral surface of the frame 50 may be gentler than the inclination of the inner lateral surface.

Examples of the material constituting the frame 50 include resins, ceramics, and metal bodies coated with insulating materials. Examples of the resin material include phenolic resins, epoxy resins, BT resins, PPA, and silicone resins. Silicone resins, which have good resistance to light, are preferably used for the material of the frame 50. A base resin serving as the base material of the frame 50 is preferably the same as a resin used for a base material of the first members 30. This structure allows for increasing adhesion between the frame 50 and the first members 30.

When a powder of a reflective material or the like that is unlikely to absorb light emitted from the light-emitting elements 40 and has a refractive index greatly different from the refractive index of the base resin is dispersed in a base resin of the frame 50, the frame 50 can efficiently reflect light emitted from the light-emitting elements 40. Examples of the reflective material include titanium oxide, aluminum oxide, zirconium oxide, and magnesium oxide. Titanium oxide is relatively stable with respect to water and the like and has a high refractive index, and thus is preferable for the reflective material. The frame 50 has a reflectance of 60% or more, preferably 90% or more, with respect to light emitted from the light-emitting elements 40. The content of the reflective material such as titanium oxide is appropriately selected according to molding conditions such as the fluidity of the resin. For example, in the case in which titanium oxide is used for the reflective material, the content of the reflective material preferably in a range of 20 wt % to 60 wt %, more preferably 25 wt % to 35 wt %. With such a structure, light that has reached the frame 50 is not easily absorbed by the frame 50, so that the light extraction of the light-emitting device 10 is improved.

First Member

As shown in FIG. 3 and FIG. 4, the first members 30 are disposed at the outer peripheral side of the frame 50 in a top view. The first members 30 cover at least a portion of the upper surface of the securing member 20C exposed from the frame 50, and inner lateral surfaces of the first members 30 are in contact with the frame 50.

With the first members 30 covering at least a portion of the upper surface of the securing member 20C, the light extraction and the light distribution of the light-emitting device 10 can be improved. Further, when the first members 30 cover the entire upper surface of the securing member 20C exposed at the outer peripheral side of the frame 50, the light extraction and the light distribution of the light-emitting device 10 can be further improved. The inner lateral surfaces of the first members 30 are in contact with the frame 50, which allows for improving adhesion between the first members 30 and the frame 50.

More specifically, as shown in FIG. 5A, a portion of light L1 emitted from the light-emitting elements 40 is reflected by a surface of a lens portion 71 of the second member 70 to be returned to the outside of the frame 50 through the lens portion 71. When the securing member 20C is made of a material that absorbs light, returned light L2 may be absorbed by the securing member 20C, but the securing member 20C is covered with the first members 30. Accordingly, the returned light L2 is emitted to the outside to be reflected light L3, without being absorbed by the securing member 20C. Accordingly, light extraction of the light-emitting device 10 can be improved.

As shown in FIG. 5B, a plurality of light-emitting devices 10 and 11 arranged adjacent to each other are used in apparatuses such as illumination devices. Also in this case, the reflected light L3 reflected by the first members 30 of the light-emitting device 10 is not absorbed by the securing member 20C of an adjacent light-emitting device 11, but is reflected by the first members 30 covering the securing member 20C, and is emitted to the outside to be reflected light L4. Accordingly, decrease in the light extraction of each of the light-emitting devices 10 and 11 can be reduced.

As shown in FIG. 1C, each of the first members 30 has the inclined region 31 (a region outward of an upper end U) in a cross-sectional view, and the height H1 of the inclined region 31 is less than the height H2 of the upper end of the frame 50.

With the first member 30 having the inclined region 31, the returned light L2 returned from the lens portion 71 of the second member 70 is reflected by the inclined region 31 to the outside in a lateral direction, to be the reflected light L3. Accordingly, light distribution of the light-emitting device 10 can be improved.

The height H1 of the inclined region 31, that is, the maximum height of the inclined region 31 from the base member 20, is preferably ⅓ or more of the height H2 of the upper end of the frame 50 from the base member 20, which allows increase in luminous flux of the extracted light.

As shown in FIG. 1C, the inclined region 31 of the first member 30 may be curved so as to be convex in a cross-sectional view, the first member 30 may be in contact with the frame 50, and the upper end U of the first member 30 may be in contact with the frame 50. The inclination of the inclined region 31 increases toward the upper end U, and the inclined region 31 preferably has an inclination angle θ defined by the inclined surface and the upper surface of the base member 20 in a range of 30° to 60°. With the inclination of the inclined region 31 as described above, the area of contact between the first member 30 and the second member 70 is larger than in the case in which the inclined region 31 is flat, and accordingly, adhesion between the first member 30 and the second member 70 can be improved. When the inner lateral surface of the first member 30 is also curved so as to be convex in a cross-sectional view, the contact area between the first member 30 and the frame 50 can be increased, and adhesion between the first member 30 and the frame 50 can be improved. The first member 30 may be laterally symmetrical or laterally asymmetrical about a perpendicular line Y1 drawn to the base from the upper end U in a cross-sectional view. When the first member 30 is laterally asymmetrical about the perpendicular line Y1 drawn to the base, the inclination of the outer lateral surface (inclined region 31) of the first member 30 can be smaller than the inclination of the inner lateral surface as shown in FIG. 1C.

With such a convex curved inclined region 31 as described above, the first member 30 reflects the returned light L2 by the lens portion 71 toward a wide area; that is, the first member 30 reflect the light to the outside not only in a lateral direction to obtain the reflected light L3 but also in an upper direction to obtain reflected light L5.

In FIG. 1C, the outer lateral surface of the first member 30 and the outer lateral surface of the frame 50 are connected to define a recess, which allows for increasing the contact area with the second member 70, so that adhesion between the second member 70 and the first member 30 and the frame 50 can be further increased.

Each first member 30 may have a shape in which the inclined region 31 is curved so as to be convex in a cross-sectional view, and the upper end U of the first member 30 may be located at the frame 50 side as shown in FIG. 1D. The expression "the upper end U may be located at the frame 50 side" as used herein refers to that the perpendicular line Y1 drawn to the base of the first member 30 from the upper end U may be located closer to the frame 50 than a perpendicular line Y2 passing through a center point C of the base. When the frame 50 is not in contact with the upper end U of the first member 30 but is in contact with only the inner lateral surface (the region inward of the upper end U) of the first member 30, much of the returned light L2 can be incident on the outer lateral surface (inclined region 31) of the first member 30, so that the reflected light L3 traveling to the outside in a lateral direction can be increased. The first member 30 may have such a structure in which the lower end of the outer lateral surface of the frame 50 is in contact with the outer lateral surface (inclined region 31) of the first member 30.

As shown in FIG. 1E, the inclined region 31 of the first member 30 can be curved so as to be convex, and the lower end of the outer lateral surface of the frame 50 can be in contact with the base member 20. With such first member 30, much of the returned light L2 can be incident on the inclined region 31 of the first member 30, so that the reflected light L3 traveling to the outside in a lateral direction can be increased.

The first member 30 may have a shape shown in FIG. 1F. The inclined region 31 of the first member 30 may be a concave-curve projecting toward the lower end of the frame 50 in a cross-sectional view, and the first member 30 may be in contact with the frame 50, and the upper end U of the first member 30 may be in contact with the frame 50. With the inclined region 31 having such a structure, the contact area between the first member 30 and the second member 70 can be larger (than in the case in which the inclined region 31 is flat), and adhesion between the first member 30 and the second member 70 is improved. When the inner lateral surface of the first member 30 is also curved so as to be concave in a cross-sectional view, the contact area between the first member 30 and the frame 50 can be increased, so that adhesion between the first member 30 and the frame 50 can be improved. The first member 30 may be laterally symmetrical or laterally asymmetrical about the perpendicular line Y1 drawn to the base from the upper end U in a cross-sectional view. With the inclined region 31 having such a concave-curve, a ratio that the returned light L2 returned from the lens portion 71 is reflected to be the reflected light L3 in a lateral direction by the first member 30 can be increased.

As shown in FIG. 1G, the inclined region 31 of the first member 30 can be a concave-curve, and the lower end of the outer lateral surface of the frame 50 can be in contact with the base member 20. Also with the first member 30 having such a structure, much of the returned light L2 can be incident on the inclined region 31 of the first member 30, so that the reflected light L3 traveling to the outside in a lateral direction can be increased.

The inclined region 31 of the first member 30 is not limited to have a convex or concave curved shape in a cross-sectional view, but may have a wavy shape including convex and concave shapes adjacent to each other or a wavy shape including a plurality of convex shapes adjacent to each other, in a cross-sectional view. When the inclined region 31 of the first member 30 is flat, light can be extracted without being irregularly reflected, so that the light extraction efficiency can be increased.

The first member 30 can be continuously disposed along the outer periphery of the frame 50 over the entirety of the outer periphery of the frame 50 in a top view. When the base member 20 has a rectangular shape and the frame 50 has a circular shape, the height H1 of the continuous first member 30 may be greater in the four corner portions of the securing member 20C in which a large portion of the securing member 20C is exposed from the frame 50 than in regions other than the four corners. With the height H1 of the first member 30 in the four corners of the base member 20 is different from the height H1 of the first member 30 in regions other than the four corners, the height H2 of the frame 50 overlapping with the upper surface of the first member 30 varies in a wavy manner over the entire circumference of the frame 50, so that the height H2 of the frame 50 is uneven over the entire circumference of the frame 50. Accordingly, the contact area between the frame 50 and the second member 70 can be increased, and the adhesion between the frame 50 and the second member 70 can be improved compared to the case in which the height H2 of the frame 50 is uniform. Also, with the height H1 of the first member 30 lower in the regions other than the four corners than in the four corners, the injected amount of the first member 30 when disposing the first member 30 can be minimized, so that takt time can be improved.

The first member 30 may be intermittently disposed along the outer periphery of the frame 50 in a top view as shown in FIG. 4. When the first member 30 is intermittently disposed, any appropriate number of the intermittent first members 30 can be disposed, and the number of the intermittent first members 30 is appropriately selected in consideration of the reflection efficiency of light returned by the lens portion 71. In the case in which the base member 20 has a rectangular shape and the frame 50 has a circular shape, the first members 30 preferably cover at least the four corners of the securing member 20C in which a large portion of the securing member 20C is exposed from the frame 50. With this structure, the first members 30 can sufficiently reflect light returned from the lens portion 71, which allows for obtaining the light-emitting device 10 with sufficient light extraction and light distribution. Also when the first members 30 are intermittently disposed, with the frame 50 in which a height in the four corners of the base member 20 and a height in the regions other than the four corners are different from each other, the contact area between the frame 50 and the second member 70 can be increased, so that adhesion between the frame 50 and the second member can be improved.

In the first members 30, a reflective material is mixed with a base material such as resins or ceramics. Examples of the base material that are preferably employed include resins such as phenolic resins, epoxy resins, BT resins, PPA, and silicone resins. A silicone resin, which has good resistance to light, is preferably used for the base resin. The base resin serving as the base material of the first members 30 is preferably the same as the base resin of the frame 50. This structure allows for increasing adhesion between the frame 50 and the first members 30.

In the first members 30, a reflective material, such as powder, that is unlikely to absorb light emitted from the light-emitting elements 40 and has a refractive index greatly different from the refractive index of the base resin can be dispersed in the base resin, which allows the first members 30 to efficiently reflect light emitted from the light-emitting elements 40.

The reflective material has a reflectance of 90% or more, preferably 95% or more with respect to light emitted from the light-emitting elements 40. With such a reflective material, the returned light L2 that has been returned from the lens portion 71 and has reached the first members 30 is not easily absorbed by the first members 30, so that the light extraction of the light-emitting device 10 can be improved.

Examples of the reflective material include titanium oxide, aluminum oxide, zirconium oxide, and magnesium oxide. Titanium oxide is relatively stable toward water and the like and has a high refractive index, and thus is preferable. The content of titanium oxide in the first members 30 is preferably in a range of 10 mass % to 60 mass %.

Second Member

As shown in FIG. 1A and FIG. 1B, the second member 70 covers the light-emitting elements 40, the frame 50, and the first members 30. The second member 70 also covers the region outward of the frame 50, which allows for increasing the contact area between the second member 70 and the frame 50, so that the second member 70 can be prevented from being detached from the frame 50. The second member 70 can cover at least a portion of each of the first lead 20A and the second lead 20B of the base member 20 outside the first members 30. This structure allows for further preventing detachment of the second member 70.

The second member 70 may have various shapes. Examples of the shape of the second member 70 include a plate shape, a lens shape with a convex upper surface, a lens shape with a concave upper surface, a Fresnel lens shape, and a convex lens shape with a recess near the center of the convex lens shape. With such a shape, directivity of light extracted from the second member 70 can be adjusted.

In the case in which the second member 70 has a lens shape, the second member 70 may include the lens portion 71, which is located above the light-emitting elements 40 and has a convex curved extraction surface, and a flange portion 72 that is located above the first members 30 and extends outward from the lower portion of the lens portion 71. With the second member 70 including the flange portion 72 with this structure, light emitted from the light-emitting elements 40 is reflected by the upper surface and the lateral surface of the flange portion 72 to be diffused in a wider area, so that the light distribution can be improved.

The second member 70 is made of a light-transmissive material through which light can be extracted. Examples of the light-transmissive material used for the second member 70 include resins, such as silicone resins and epoxy resins, and glass.

The second member 70 may have any appropriate cross-sectional diameter D3 (see FIG. 1B), as long as the second member 70 can cover the light-emitting elements 40, the frame 50, and the first members 30. The cross-sectional diameter D3 of the second member 70 is appropriately selected in consideration of the area of emission of light emitted from the light-emitting elements 40.

The second member 70 may have any appropriate refractive index as long as the difference in refractive index between the second member 70 and the air is in an appropriate range. A refractive index of the second member 70 is preferably in a range of about 1.4 to 1.6. With the second member 70 having a refractive index in such a range, light extraction can be improved.

The light-emitting device 10 according to the first embodiment may further include the protective element 90 as shown in FIG. 1A. The protective element 90 is mounted on a connecting end portion 21B1 of the second lead 20B and electrically connected to the mounting portion 21A of the first lead 20A by a wire 60. The protective element 90 may be mounted at a position other than the position described above, and the protective element 90 may be mounted on the mounting portion 21A of the first lead 20A.

For example, the protective element 90 blocks the electric current flowing in the reverse direction when a reverse voltage is applied to the light-emitting elements 40, and prevents overcurrent through the light-emitting elements 40 when a forward voltage higher than the operating voltage of the light-emitting elements 40 is applied to the light-emitting elements 40. Examples of the protective element 90 include a protection circuit and an electrostatic protection element. More specifically, a Zener diode can be used for the protective element 90.

Methods of Manufacturing Light-Emitting Device

Next, two methods of manufacturing the light-emitting device according to the first embodiment will be described.

First Method of Manufacturing

Figure 6:
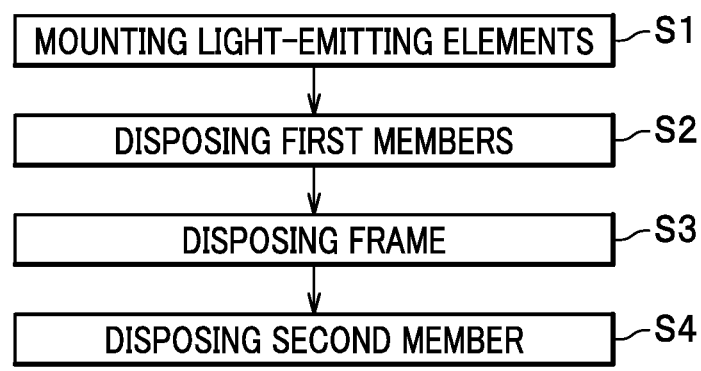
FIG. 6 is a flowchart of a first method of manufacturing the light-emitting device according to the first embodiment.
Figure 7A:
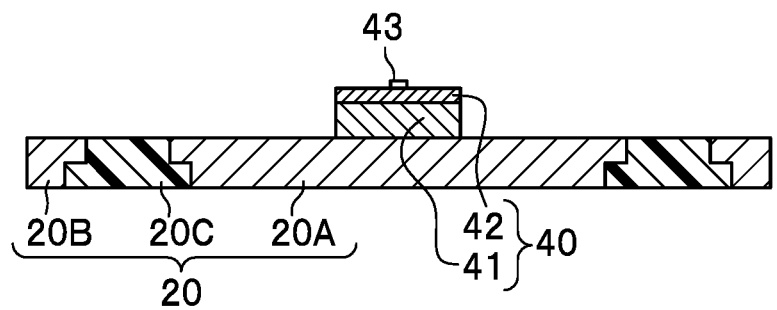
FIG. 7A is a schematic cross-sectional view taken along the line VIIA-VIIA of FIG. 2, showing a base member on which light-emitting elements are disposed in the manufacturing of the first method of manufacturing the light-emitting device according to the first embodiment.
Figure 7B:
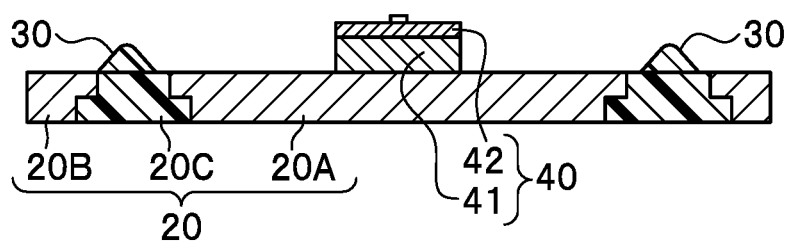
FIG. 7B is a schematic cross-sectional view taken along the line VIIB-VIIB of FIG. 3, showing the base member on which first members are disposed in the manufacturing of the first method of manufacturing the light-emitting device according to the first embodiment.
Figure 7C:
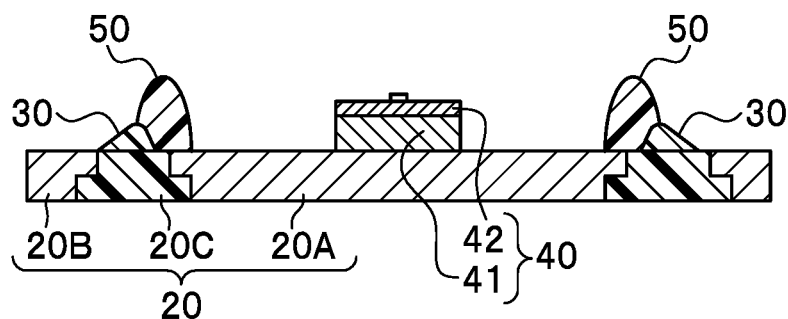
FIG. 7C is a schematic cross-sectional view taken along the line VIIC-VIIC of FIG. 4, showing the base member on which the frame is disposed in the manufacturing of the first method of manufacturing the light-emitting device according to the first embodiment.
Figure 7D:
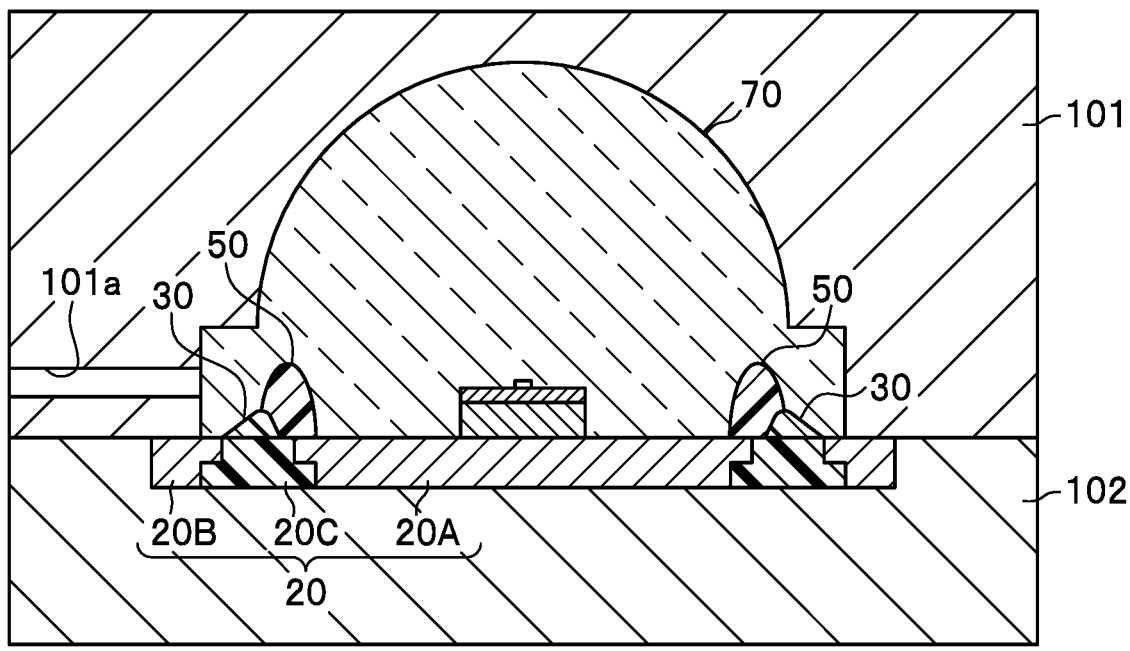
FIG. 7D is a schematic cross-sectional view illustrating disposing of the second member in the manufacturing of the first method of manufacturing the light-emitting device according to the first embodiment.

FIG. 6 is a flowchart illustrating a first method of manufacturing the light-emitting device according to the first embodiment. FIG. 7A is a schematic cross-sectional view taken along the line VIIA-VIIA of FIG. 2, showing the base member on which the light-emitting elements are mounted in the manufacturing of the first method of manufacturing the light-emitting device according to the first embodiment. FIG. 7B is a schematic cross-sectional view taken along the line VIIB-VIIB of FIG. 3, showing the base member on which the first members are disposed in the manufacturing process of the first method of manufacturing the light-emitting device according to the first embodiment. FIG. 7C is a schematic cross-sectional view taken along the line VIIC-VIIC of FIG. 4, showing the base member on which the frame is disposed in the manufacturing process of the first method of manufacturing the light-emitting device according to the first embodiment. FIG. 7D is a schematic cross-sectional view for illustrating a method for disposing the second member in the manufacturing process of the first method of manufacturing the light-emitting device according to the first embodiment. In FIG. 7A to FIG. 7C, illustration of wires is omitted.

As shown in FIG. 6 and FIG. 7A to FIG. 7D, the method of manufacturing a light-emitting device 10 includes Step S1 of mounting light-emitting elements 40 on an upper surface of a base member 20 including the a lead 20A, a second lead 20B, and a securing member 20C securing the first lead 20A and the second lead 20B; Step S2 of disposing one or more first members 30 containing a reflective material on the upper surface of the base member 20 to surround the light-emitting elements 40 and cover at least a portion of the upper surface of the securing member 20C; Step S3 of disposing the frame 50 on the upper surface of the base member 20 such that the frame 50 is in contact with the inner lateral surfaces of the first members 30 and the upper surface of the base member 20, has a height from the base member 20 greater than the height of the first members 30 in a cross-sectional view, and surrounds the light-emitting elements 40; and Step S4 of disposing the second member 70 to cover the light-emitting elements 40, the frame 50, and the first members 30. The steps will be described below.

(1) Step S1 of Mounting Light-Emitting Elements

As shown in FIG. 7A, in Step S1 of mounting light-emitting elements, the light-emitting elements 40 are mounted on the upper surface of the base member 20 in which the securing member 20C secures the first lead 20A and the second lead 20B. The light-emitting elements 40 are preferably mounted on the mounting portion 21A of the first lead 20A.

In Step S1 of mounting light-emitting elements, two light-emitting elements 40 (see FIG. 1A) are mounted on the base member 20 using a known technique, and the lower surfaces of the two light-emitting elements 40 on the element substrate 41 are bonded to the upper surface of the base member 20 using known bonding members. Next, an n-electrode 43 of one of the light-emitting elements 40 (a first light-emitting element 40) is electrically connected to the first lead 20A by a wire 60 as shown in FIG. 1A. The p-electrode 44 of the other of the light-emitting elements 40 (a second light-emitting element 40) is electrically connected to the second lead 20B by a wire 60. In addition, the p-electrode 44 of the first light-emitting element 40 is electrically connected to the n-electrode 43 of the second light-emitting element 40 by a wire 60. The protective element 90 may be electrically connected to the first lead 20A by a wire 60. A known technique such as ball bonding or wedge bonding may be employed for the wire bonding.

(2) Step S2 of Disposing First Members

As shown in FIG. 7B, in Step S2 of disposing first members, the first members 30 containing the reflective material are disposed on the upper surface of the base member 20. Step S2 of disposing first members is performed before Step S3 of disposing a frame, which allows for facilitating recognition of the areas in which the first members 30 are to be disposed on the upper surface of the base member 20, so that the first members 30 can be accurately disposed. Recognition of the positions of the leads is required when the first members are applied to the base member 20. Performing Step S2 of disposing first members before Step S3 of disposing a frame allows for reducing positional information of the leads, so that the positions of the leads can be accurately recognized.

In Step S2 of disposing first members, when the base material of the first members 30 is a resin, the first members 30 with the uncured base resin are injected to be disposed on the upper surface of the base member 20 using a known method, to surround the two light-emitting elements 40 (see FIG. 1A) and to cover at least a portion of the upper surface of the securing member 20C. The first members 30 may be cured together with the frame 50 in subsequent Step S3 of disposing a frame, or may be cured before Step S3 of disposing a frame. Adjusting the viscosity of the first members 30 in the uncured state allows for adjusting the shape of the inclined regions 31 of the first members 30 in the cured state in a cross-sectional view to be a convex or concave curved shape (see FIG. 1C, FIG. 1D, and FIG. 1F) or a flat shape.

In Step S2 of disposing first members, solid bodies made of a resin or a ceramic may be produced and disposed on the upper surface of the base member 20 to cover at least a portion of the upper surface of the securing member 20C.

The first members 30 may be continuously or intermittently injected. In the case of discontinuous pouring, the first members 30 may be just poured respectively in the four corners of the securing member 20C or may be poured on the portions connecting the four corners of the securing member 20C after pouring the first members 30 respectively in the four corners of the securing member 20C such that the first members 30 are connected to each other in an annular manner in a top view.

(3) Step S3 of Disposing Frame

As shown in FIG. 7C, in Step S3 of disposing a frame, the frame 50 is disposed on the upper surface of the base member 20. In Step S3 of disposing a frame, the frame 50 with the uncured base resin is injected to be disposed on the upper surface of the base member 20 such that the frame 50 surrounds the two light-emitting elements 40 (see FIG. 1A), such that the frame 50 is in contact with the inner lateral surfaces of the first members 30 and the upper surface of the base member 20, and such that the frame 50 has a height from the base member 20 greater than a height of the first members 30 in a cross-sectional view. The frame 50 is then cured. The frame 50 is disposed such that the lower end of the outer lateral surface of the frame 50 is in contact with the upper ends of the first members 30 in FIG. 7C. Meanwhile, the lower end of the outer lateral surface of the frame 50 may be in contact with the outer lateral surfaces of the first members 30 located outward of the upper ends of the first members 30 (that is, in contact with the inclined regions 31 of the first members 30), or the lower end of the outer lateral surface of the frame 50 may be in contact with the inner lateral surfaces of the first members 30 located inward of the upper ends of the first members 30. In the case in which the frame 50 is disposed such that the lower end of the outer lateral surface of the frame 50 is in contact with the outer lateral surfaces of the first members 30 located outward of the upper ends of the first members 30, the contact area between the first members 30 and the frame 50 can be increased, and adhesion between the first members 30 and the frame 50 can be improved.

(4) Step S4 of Disposing Second Member

As shown in FIG. 7D, in Step S4 of disposing a second member, the second member 70 is disposed to cover the light-emitting elements 40, the frame 50, and the first members 30. In Step S4 of disposing a second member, the second member 70 may be disposed to cover at least a portion of each of the first lead 20A and the second lead 20B outside the first members 30.

In Step S4 of disposing a second member, the second member 70 is preferably disposed using, for example, transfer molding. In the transfer molding, an upper die 101 defining a recess having a shape corresponding to the second member 70, such as a shape corresponding to the lens portion 71 and the flange portion 72, is disposed on the upper surface of the base member 20 such that the recess covers the light-emitting elements 40, the frame 50, and the first members 30. Next, a lower die 102 is disposed to cover the lower surface of the base member 20, on which the light-emitting elements 40, the frame 50, and the first members 30 are not disposed. In this arrangement, the edge of the recess of the upper die 101 corresponding to the lens portion 71 is located outside the frame 50, and the frame 50 is preferably not in contact with the surface defining the recess of the upper die 101. After that, unhardened resin or glass to become the second member 70 is injected into the recess through an inlet 101a and hardened. The second member 70 covering the light-emitting elements 40, the frame 50, and the first members 30 is thus disposed on the upper surface of the base member 20. The second member 70 may be disposed to also cover at least a portion of each of the first lead 20A and the second lead 20B outside the first members 30.

Second Manufacturing Method

Figure 8:
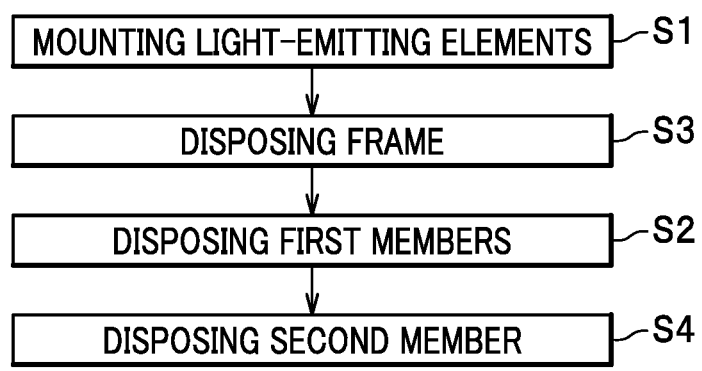
FIG. 8 is a flowchart showing a second method of manufacturing the light-emitting device according to the first embodiment.
Figure 9A:
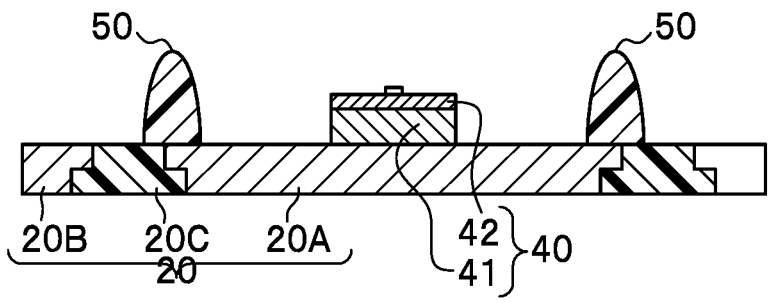
FIG. 9A is a schematic cross-sectional view of the base member on which the frame is disposed in the manufacturing of the second method of manufacturing the light-emitting device according to the first embodiment.
Figure 9B:
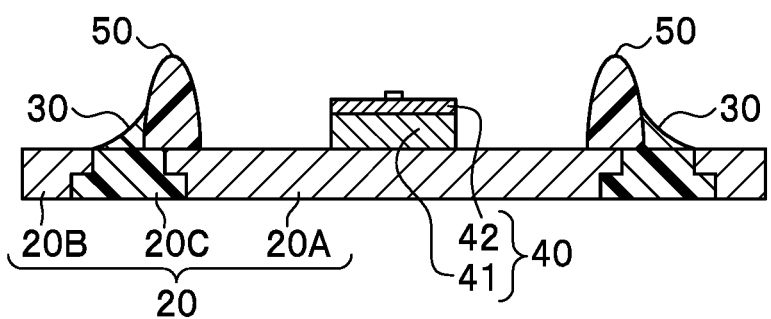
FIG. 9B is a schematic cross-sectional view of the base member on which the first members are disposed in the manufacturing of the second method of manufacturing the light-emitting device according to the first embodiment.

FIG. 8 is a flowchart of a second method of manufacturing the light-emitting device according to the first embodiment. FIG. 9A is a schematic cross-sectional view of the base member on which the frame is disposed in the manufacturing using the second method of manufacturing the light-emitting device according to the first embodiment. FIG. 9B is a schematic cross-sectional view of the base member on which the first members are disposed in the manufacturing using the second method of manufacturing the light-emitting device according to the first embodiment. In FIG. 9A and FIG. 9B, illustration of wires is omitted.

The second method of manufacturing the light-emitting device according to the first embodiment is substantially the same as the first method of manufacturing described above (see FIG. 6) except that Step S3 of disposing a frame is performed before Step S2 of disposing first members.

As shown in FIG. 9A, in Step S3 of disposing a frame, the frame 50 with the uncured base resin is injected to be disposed on the upper surface of the base member 20 to surround the light-emitting elements 40. The frame 50 is preferably cured before Step S2 of disposing first members. With this operation, the shape of the frame 50 does not change when the first members 30 are formed, and a predetermined shape of the frame 50 can be maintained. The frame 50 with the uncured base resin can be injected to be located on the boundary between the securing member 20C and the first lead 20A.

As shown in FIG. 9B, in Step S2 of disposing first members, the first members 30 containing the reflective material with the uncured base resin are injected to be disposed in contact with the outer lateral surface of the frame 50 and the upper surface of the base member 20, so as to cover at least a portion of the upper surface of the securing member 20C exposed at the outer peripheral side of the frame 50 such that the first members 30 have a height from the base member 20 less than a height of the frame 50 in a cross-sectional view. Adjusting the viscosity of the first members 30 allows for adjusting the shape of the inclined regions 31 of the first members 30 in a cross-sectional view to be a convex or concave curved shape in which the height from the base member 20 increases as the distance from the frame 50 decreases (see FIG. 1E and FIG. 1G) or a flat shape.

In the case in which Step S2 of disposing first members is performed after Step S3 of disposing a frame, the shape of the inclined regions 31 of the first members 30 in a cross-sectional view is easily controlled. Accordingly, controlling the shape of the first members 30 allows for controlling light distribution of the light-emitting device 10. In addition, the amount of the first members 30 to be applied can be minimized, so that the manufacturing efficiency can be improved.

Second Embodiment

Light-Emitting Device

Figure 10:
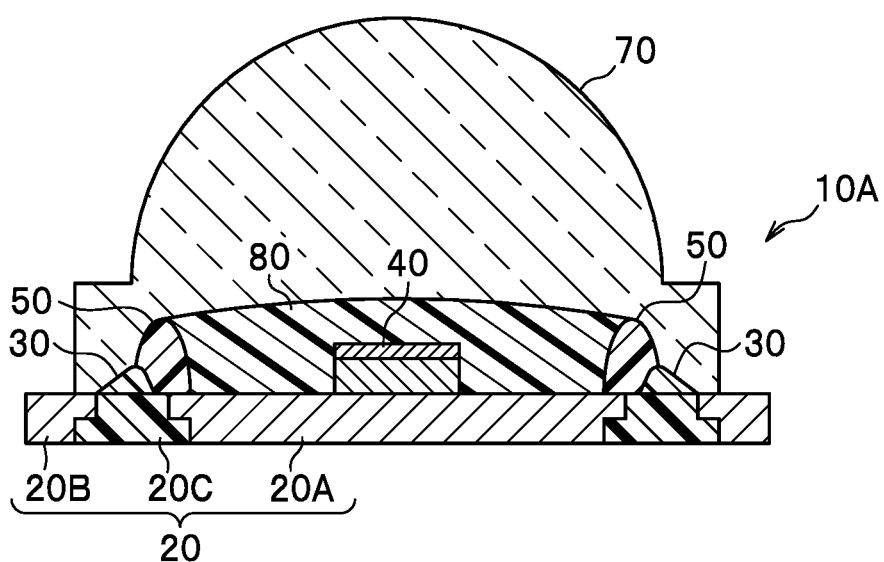
FIG. 10 is a schematic cross-sectional view of a structure of a light-emitting device according to a second embodiment.

A light-emitting device according to a second embodiment will be described. FIG. 10 is a schematic cross-sectional view of the structure of the light-emitting device according to the second embodiment. The same portions of the structure as those in the light-emitting device according to the first embodiment are indicated by the same reference numerals, and repetitive descriptions thereof may be omitted.

As shown in FIG. 10, a light-emitting device 10A includes a third member 80 disposed inward of the frame 50 to cover the light-emitting elements 40 in addition to the structure of the light-emitting device 10. The second member 70 covers the light-emitting elements 40, the third member 80, the frame 50, and the first members 30. The third member 80 of the light-emitting device 10A preferably contains a phosphor.

With the third member 80, entry of dust or the like into the light-emitting device 10A from the outside can be further reduced, the wires 60 can be protected, so that reliability can be improved. If the third member 80 contains a phosphor, light emitted from the light-emitting elements 40 can be subjected to wavelength conversion, so that the color of light to be extracted can be adjusted. In addition, light that has been subjected to wavelength conversion by the phosphor is nondirectionally emitted in all directions, and light that has been returned from the lens portion 71 and strikes the securing member 20C exposed at the outer peripheral side of the frame 50 can be increased. The first members 30 cover the upper surface of the securing member 20C, and the returned light returned from the lens portion 71 is reflected by the first members 30 in the upward and lateralward directions to serve as extracted light. Accordingly, light extraction and the light distribution of the light-emitting device 10A are improved.

Third Member 80

The third member 80 covers the light-emitting elements 40 and seals the light-emitting elements 40 inward of the frame 50. The third member 80 may have a height greater than the height of the frame 50 and have a curved shape in which the center portion of the third member 80 projects upward such that the third member 80 has a greatest height at a location directly above the light-emitting elements 40 and such that the third member is in contact with the inner lateral surface of the frame 50 in a cross-sectional view as shown in FIG. 10. This structure allows for obtaining an effect of reducing reflected light generated at the interface between the third member 80 and the second member 70. Alternatively, the third member 80 may have a height not greater than the height of the frame 50 and be in contact with the inner lateral surface of the frame 50.

A light-transmissive resin or glass may be used for a material of the third member 80. A resin is preferably used for the third member 80. In the case in which resins are used for base materials of the first members 30 and the frame 50, using a resin for the third member 80 allows for improving adhesion between the third member 80 and the first members 30 and adhesion between the third member 80 and the frame 50. Examples of the resin for the third member 80 include polycarbonate resins, epoxy resins, phenolic resins, silicone resins, acrylic resins, polymethylpentene resins, polynorbornene resins, modified resins of these resins, and hybrid resins each containing one or more of these resins. A dimethyl silicone resin or a phenyl silicone resin, which has good resistance to light, is preferably used for a material of the third member 80. The third member 80 preferably contains a phosphor and may contain a light-diffusing agent. In the case in which the third member 80 contains a phosphor, the shape of the upper surface of the third member 80 is preferably curved such that a center portion of the upper surface of the third member 80 projects downward to reduce the distance between the phosphor and the light-emitting elements 40 in consideration of the luminous efficacy.

Phosphor

Particles of a phosphor adapted to be excited by light emitted from the light-emitting elements 40 and to convert wavelength of light emitted from the light-emitting elements 40 or convert wavelength of light reflected by the first members 30 is used for the phosphor. Examples of a phosphor adapted to be excited by a blue or ultraviolet light-emitting element include cerium-activated yttrium-aluminum-garnet phosphors (YAG:Ce); cerium-activated lutetium-aluminum-garnet phosphors (LAG:Ce); europium- and/or chromium-activated nitrogen-containing calcium aluminosilicate phosphors ($CaO-Al_2O_3-SiO_2$:Eu,Cr); europium-activated silicate phosphors (($Sr,Ba)_2SiO_4$:Eu); nitride phosphors such as β-SiAlON phosphors, CASN phosphors, and SCASN phosphors; fluoride phosphors such as KSF phosphors; sulfide phosphors; chloride phosphors; silicate phosphors; phosphate phosphors; and quantum-dot phosphors. Combination of such phosphors and blue or ultraviolet light-emitting elements allows for obtaining light-emitting devices 10 configured to emit light having various wavelengths.

Light-Diffusing Agent

Examples of a material of the light-diffusing agent include titanium oxide, zirconium oxide, aluminum oxide, and silicon oxide. Titanium oxide is preferable because titanium oxide is comparatively stable toward water and the like and has a high refractive index.

Methods of Manufacturing Light-Emitting Device

Figure 11:
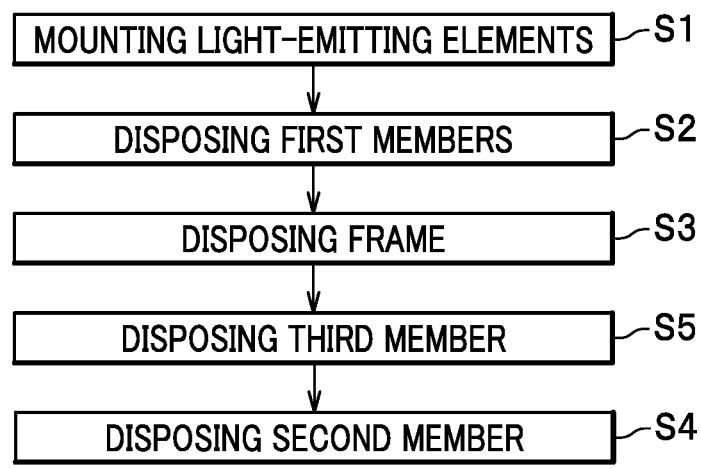
FIG. 11 is a flowchart of a first method of manufacturing the light-emitting device according to the second embodiment.
Figure 12:
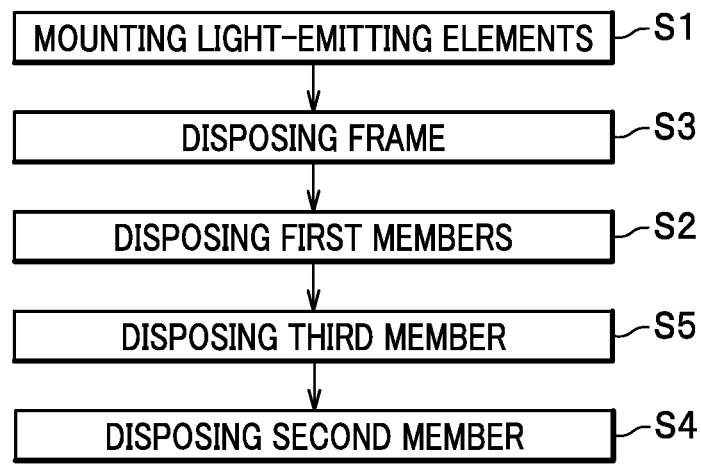
FIG. 12 is a flowchart of a second method of manufacturing the light-emitting device according to the second embodiment.

Next, two methods of manufacturing the light-emitting device according to the second embodiment will be described. FIG. 11 is a flowchart of a first method of manufacturing the light-emitting device according to the second embodiment. FIG. 12 is a flowchart of a second method of manufacturing the light-emitting device according to the second embodiment. Steps that are the same as those in the methods of manufacturing the light-emitting device according to the first embodiment are indicated by the same reference numerals, and repetitive descriptions thereof may be omitted.

First Method of Manufacturing

As shown in FIG. 11, the first method of manufacturing the light-emitting device 10A further includes Step S5 of disposing a third member after Step S3 of disposing a frame in addition to the steps of the method of manufacturing the light-emitting device 10 (see FIG. 6).

In the first method of manufacturing the light-emitting device 10A, the inclined regions 31 of the first members 30 may be curved so as to be convex (see FIG. 1C and FIG. 1D) to project upward of the base member 20 in a cross-sectional view, or may be curved so as to be concave (see FIG. 1F) and to project toward the lower end of the frame 50 in a cross-sectional view. In Step S4 of disposing a second member, the second member 70 is disposed to cover the light-emitting elements 40, the third member 80, the frame 50, and the first members 30.

The first method of manufacturing the light-emitting device 10A including Step S5 of disposing a third member allows for improving reliability of the light-emitting device 10A and color of extracted light.

(1) Step S5 of Disposing Third Member

In Step S5 of disposing a third member, the third member 80 is disposed inward of the frame 50 to cover the light-emitting elements 40. The third member 80 is disposed using a known method such as potting or spraying.

While the third member 80 has a curved shape in which the center portion of the third member 80 projects upward such that the third member 80 has a greatest height at a location directly above the light-emitting elements 40 in the above description, the third member 80 may have a uniform height or may have a curved shape in which the center portion of the third member 80 projects downward.

In the first method of manufacturing according to the second embodiment in which the first members 30 are disposed before the frame 50 is disposed, when manufacturing the light-emitting device 10A including the rectangular base member 20, the circular frame 50, and the first members 30 continuously disposed along the outer periphery of the frame 50 over the entirety of the outer periphery of the frame 50 in a top view, Step S2 of disposing first members is preferably performed as described below.

The amounts of the first members 30 to be injected in Step S2 of disposing first members are preferably increased at four corners of the securing member 20C exposed outside the frame 50 and are preferably reduced at positions other than the four corners. In Step S3 of disposing a frame, the height of the upper end of the frame 50 in contact with the first members 30 varies in a wavy manner over the entire circumference of the frame 50; that is, the height of the frame 50 is uneven over the entire circumference of the frame 50. Further, in Step S4 of disposing a second member, with the uneven height of the frame 50, the contact area between the frame 50 and the second member 70 can be increased, and accordingly, adhesion between the frame 50 and the second member 70 can be improved, compared with the case in which the height of the frame 50 is uniform.

Second Method of Manufacturing

As shown in FIG. 12, a second method of manufacturing the light-emitting device 10A further includes Step S5 of disposing a third member after Step S2 of disposing first members, in addition to the steps of the second method of manufacturing the light-emitting device 10 (see FIG. 8). In the second method of manufacturing the light-emitting device 10A, the inclined regions 31 of the first members 30 may have a concave curved shape (see FIG. 1G) projecting toward the lower end of the frame 50 in a cross-sectional view, or may have a convex curved shape (see FIG. 1E) in a cross-sectional view. In Step S4 of disposing a second member, the second member 70 is disposed to cover the light-emitting elements 40, the third member 80, the frame 50, and the first members 30.

With the second method of manufacturing the light-emitting device 10A including Step S5 of disposing a third member, the reliability of the light-emitting device 10A and color of extracted light can be improved.

While certain embodiments of the present invention are described above, the scope of the present invention is not limited to these embodiments, but rather should be broadly interpreted on the basis of the claims. The scope of the present invention also encompasses various modifications of the described embodiments.

What is claimed is:

1. A light-emitting device comprising:
   a base member comprising:
      a first lead,
      a second lead, and
      a securing member securing the first lead and the second lead;
   a light-emitting element mounted on an upper surface of the base member;
   a frame disposed on the upper surface of the base member to surround the light-emitting element;
   a first member covering at least a portion of an upper surface of the securing member that is exposed at an outer peripheral side of the frame in a top view, the first member being in contact with an outer lateral surface of the frame and containing a reflective material; and
   a second member covering the light-emitting element, the frame, and the first member,
   wherein the first member has an inclined region in a cross-sectional view, and
   wherein a maximum height of the inclined region is less than a height of an upper end of the frame.

2. The light-emitting device according to claim 1, wherein a base material of the first member comprises a resin.

3. The light-emitting device according to claim 1, wherein the frame is located on a boundary between the securing member and the first lead.

4. The light-emitting device according to claim 1, wherein the inclined region is curved so as to be convex in a cross-sectional view.

5. The light-emitting device according to claim 1, wherein:
   the inclined region is curved so as to be convex in a cross-sectional view, and
   an upper end of the first member is located at a frame side and is not in contact with the frame.

6. The light-emitting device according to claim 1, wherein the inclined region is curved so as to be concave and to project toward a lower end of the frame in a cross-sectional view.

7. The light-emitting device according to claim 1, wherein the reflective material comprises titanium oxide.

8. The light-emitting device according to claim 1, wherein the frame and the first member comprise a same base resin.

9. The light-emitting device according to claim 1, wherein:
   the second member comprises a light-transmissive material and includes:
      a lens portion on the light-emitting element, and
      a flange portion located on the first member and extending outward from a lower portion of the lens portion.

10. The light-emitting device according to claim 1, further comprising:
    a third member disposed inward of the frame and covering the light-emitting element, wherein the second member covers the light-emitting element, the third member, the frame, and the first member.

11. The light-emitting device according to claim 10, wherein the third member contains a phosphor.

12. The light-emitting device according to claim 1, wherein the first member is continuously disposed along the outer periphery of the frame over an entirety of the outer periphery of the frame in a top view.

13. The light-emitting device according to claim 12, wherein:
the base member is rectangular in the top view, and
the first member is disposed at least at four corners of the securing member exposed at the outer peripheral side of the frame.

14. The light-emitting device according to claim 1, wherein the first member is intermittently disposed along the outer periphery of the frame in a top view.

15. The light-emitting device according to claim 14, wherein:
the base member is rectangular in the top view, and
the first member is disposed at least at four corners of the securing member exposed at the outer peripheral side of the frame.

16. A method of manufacturing a light-emitting device, the method comprising:
mounting a light-emitting element on an upper surface of a base member, the base member comprising:
a first lead,
a second lead, and
a securing member securing the first lead and the second lead;
disposing a first member comprising a reflective material on the upper surface of the base member to surround the light-emitting element and to cover at least a portion of an upper surface of the securing member;
disposing a frame on the upper surface of the base member such that the frame is in contact with an inner lateral surface of the first member and the upper surface of the base member, has a height from the base member greater than a height of the first member in a cross-sectional view, and surrounds the light-emitting element; and
disposing a second member to cover the light-emitting element, the frame, and the first member.

17. The method of manufacturing a light-emitting device according to claim 16, further comprising:
after the step of disposing the frame, disposing a third member inside the frame to cover the light-emitting element,
wherein, in the step of disposing the second member, the second member is disposed to cover the light-emitting element, the third member, the frame, and the first member.

18. A method of manufacturing a light-emitting device, the method comprising:
mounting a light-emitting element on an upper surface of a base member, the base member comprising:
a first lead,
a second lead, and
a securing member securing the first lead and the second lead;
disposing a frame on the upper surface of the base member to surround the light-emitting element;
disposing a first member comprising a reflective material such that the first member is in contact with an outer lateral surface of the frame and the upper surface of the base member, covers at least a portion of an upper surface of the securing member exposed at an outer peripheral side of the frame, and has a height from the base member less than a height of the frame in a cross-sectional view; and
disposing a second member to cover the light-emitting element, the frame, and the first member.

19. The method of manufacturing a light-emitting device according to claim 18, further comprising:
after the step of disposing a first member, disposing a third member inward of the frame to cover the light-emitting element,
wherein, in the step of disposing the second member, the second member is disposed to cover the light-emitting element, the third member, the frame, and the first member.

* * * * *